United States Patent
Leavitt et al.

(10) Patent No.: US 6,744,017 B2
(45) Date of Patent: Jun. 1, 2004

(54) WAFER HEATING DEVICES FOR USE IN ION IMPLANTATION SYSTEMS

(75) Inventors: William Leavitt, Haverhill, MA (US); Christopher Berry, Exeter, NH (US); Thomas Doyon, Manchester, NH (US); David Sabo, Hollis, NH (US)

(73) Assignee: IBIS Technology Corporation, Danvers, MA (US)

( * ) Notice: Subject to any disclaimer, the term of this patent is extended or adjusted under 35 U.S.C. 154(b) by 5 days.

(21) Appl. No.: 10/157,664

(22) Filed: May 29, 2002

(65) Prior Publication Data

US 2003/0222072 A1 Dec. 4, 2003

(51) Int. Cl.⁷ .................................................. F27B 5/14
(52) U.S. Cl. ........................ 219/390; 219/405; 219/411; 392/416; 392/418; 118/724; 118/725; 118/50.1
(58) Field of Search .......................... 219/390, 405, 219/411, 738, 685, 680, 757; 392/416, 418, 407–408, 422; 118/724, 725, 50.1; 315/56, 60, 52, 94, 98, 46; 313/490, 491, 493, 494

(56) References Cited

U.S. PATENT DOCUMENTS

| | | | | |
|---|---|---|---|---|
| 3,836,751 A | * | 9/1974 | Anderson | 219/411 |
| 3,862,397 A | * | 1/1975 | Anderson et al. | 219/405 |
| 4,871,944 A | * | 10/1989 | Skwirut et al. | 315/56 |
| 5,790,751 A | * | 8/1998 | Gronet et al. | 392/416 |
| 5,878,191 A | | 3/1999 | Miyashita et al. | |
| 6,093,919 A | * | 7/2000 | Seo et al. | 219/685 |
| 2001/0036706 A1 | | 11/2001 | Kitamura | |

FOREIGN PATENT DOCUMENTS

| | | |
|---|---|---|
| EP | 0 374 511 A2 | 6/1990 |
| EP | 0 451 740 A2 | 10/1991 |
| EP | 0 641 016 A1 | 3/1995 |
| WO | WO 02/084712 A2 | 10/2002 |

OTHER PUBLICATIONS

IBIS–1000 Maintenance Manual. Published Apr. 5, 1999.*

* cited by examiner

*Primary Examiner*—Shawntina Fuqua
(74) *Attorney, Agent, or Firm*—Thomas J. Engellenner; Reza Mollaaghababa; Nutter, McClennen & Fish, LLP

(57) ABSTRACT

The present invention provides a heating assembly that includes a thermally conductive, lamp-mounting block manufactured from aluminum or a similar material, which can be machined as a single-piece (e.g., unibody) block. The unibody block includes one or more networks of inner passageways bored or otherwise machined within the block for transporting one or more cooling fluids. The mounting block can also have a reflective coating on one or more of its surfaces that face the lamps to efficiently reflect heat and/or light generated by the lamps onto a desired surface, for example, a semiconductor wafer. Thermal isolation devices, e.g., pads, provide for both physical mounting of the heating lamps to the mounting block and also provide thermal isolation between the heating lamp and its electrical connections are also disclosed to protecting heat-sensitive elements of the heating assembly such as seals.

18 Claims, 6 Drawing Sheets

A-A

WAFER HEATING DEVICES FOR USE IN ION IMPLANTATION SYSTEMS

BACKGROUND OF THE INVENTION

The present invention relates generally to ion implantation systems, and more particularly, to heating assemblies for raising the temperature of a wafer to an elevated level within an evacuated chamber of an ion implantation system.

Processing of semiconductor wafers by ion implantation is routinely practiced in manufacturing integrated circuits. Ion implantation is typically performed in an evacuated chamber in which a semiconductor wafer is exposed to a beam of ions having a selected energy. In some ion implantation techniques, the wafer is heated to elevated temperatures during ion implantation steps to dynamically anneal defects generated in the wafer as a result of ion bombardment, and/or during subsequent annealing steps.

Heating a substrate within the vacuum environment of an ion implantation chamber has proven difficult. Many materials, especially heating lamps, fail quickly when heated in a vacuum environment, especially if provisions for cooling the lamps are not provided. Typically, metal blocks are utilized to mount the lamps in order to provide a heat sink for dissipating the heat generated by the lamps. It has generally been thought that a metal, such as copper, with very high thermal conductivity is the ideal choice for such a mounting block. Copper is also preferred because it is easy to electroplate, thereby facilitating the deposition of mirror-like reflective coatings. By coating the surface of the block that lies behind the lamp, the efficiency of radiant heat transfer is enhanced.

Nonetheless, copper mounting blocks have a number of drawbacks, not the least of which is that copper is difficult to machine. Internal networks for transmitting cooling fluids within the block need to be bored or otherwise machined into the block, but due to the relative softness of copper and copper alloys, the conventional copper mounting block is usually constructed from multiple pieces, each machined with a portion of the required networks. The pieces must then braised together and tested for integrity. Multiple-piece braised components subjected to large-gradient temperatures can be prone to leakage and other structural failures, as well as requiring complex and time-consuming manufacturing and assembly techniques.

Accordingly, there is a need for simpler heating devices that can withstand the rigors of a vacuum environment and repeated heating with greater ease of manufacturing. There is also a need for such heating devices that can perform in a vacuum environment without failure over extended time periods.

SUMMARY OF THE INVENTION

The present invention provides a heating assembly that includes a thermally conductive, lamp-mounting block manufactured from aluminum or a similar material, which can be machined as a single-piece (e.g., unibody) block. The unibody block includes one or more networks of inner passageways bored or otherwise machined within the block for transporting one or more cooling fluids. The mounting block can also have a reflective coating on one or more of its surfaces that face the lamps to efficiently reflect heat and/or light generated by the lamps onto a desired surface, for example, a semiconductor wafer. Thermal isolation devices, e.g., pads, provide for both physical mounting of the heating lamps to the mounting block and also provide thermal isolation between the heating lamp and its electrical connections are also disclosed for protecting heat-sensitive elements of the heating assembly such as seals.

In one aspect, the thermally conductive block can include a plurality of openings formed therein that are in fluid communication with at least one of the inner passageways. The openings are preferably formed in proximity of the lamps to allow a flow of a cooling fluid circulating through the passageways onto the lamps, thereby cooling the lamps. The openings can be formed along the length of a heating lamp, for example, in a single row, or in multiple rows each positioned at one side of the lamp. In some embodiments, two rows of openings are utilized in which the openings in one row are offset relative to those in the other row to maximize the area of the lamp that will be in contact with the cooling fluid. Those having ordinary skill in the art will appreciate that other arrangements of openings can also be utilized so long as the flow of a cooling fluid through the openings is substantially directed onto a lamp to be cooled.

In a related aspect, the passageway that is in fluid communication with the openings can receive a gaseous cooling fluid (e.g., air or nitrogen) and allow it to expand on and around the heating lamp, via the plurality of openings, to remove heat generated by the lamps. Another passageway can be utilized to circulate a cooling fluid, e.g., water, through the block from an inlet port to an outlet port.

In further aspects, the heating assembly can include a cover, for example, a quartz tube, in which the lamp and block can be disposed. One or more seals, for example, O-ring seals, formed in the block can seal the cover, thereby insulating the lamps from an external environment in which the heating assembly is positioned.

In another aspect, the thermally conductive block is formed of aluminum, and is coated with a highly reflective material, such as, gold. A primer layer, for example, a nickel layer, can be applied to the aluminum block prior to application of the high reflective coating in order to enhance the adhesion of the reflective coating to the block. The use of aluminum for forming the block is particularly advantageous in that it allows readily forming the inner passageways in the block.

Still another aspect of the invention, the thermally conductive block is manufactured as a unibody construction. Internal networks of passageways can be manufactured via "gun-drilling" methods and techniques, for example.

The present invention also provides a heating assembly for use in an ion implantation system that includes a heating assembly formed of a lamp and a thermally conductive block holding the lamp. The lamp is capable of heating a silicon wafer during the implantation process for reducing or eliminating surface damage, particularly amorphous layering, of the wafer. The thermally conductive block has a layer of gold over a primer layer to increase efficiency and reduce parasitic heating of the block. Further, the block has a series of passageways through which a cooling fluid can be circulated to remove heat, as well as a series of passageways through which a compressible cooling fluid can be introduced and expanded over and around the lamp. The assembly is surrounded by a cover, e.g., a quartz tube, sealed at each end providing separation of the heating assembly environment from the vacuum of the ion implantation device. The invention also includes a mount supplying a physical attachment for the heating assembly, and also couplings for electrical supplies and cooling fluid inlets and outlets.

A heating assembly according to the invention can be utilized in a variety of different applications. For example, such a heating assembly can be employed in an evacuated chamber of an ion implantation chamber to provide heating of semiconductor wafers during ion implantation and/or annealing steps. In such an application, the heating assembly can be coupled to a mount for stable positioning within an end station of the ion implantation chamber. The mount can include inlet and outlet ports to allow flow of cooling fluids from an external source into the inner passageways of the block.

Further understanding of the invention can be obtained by reference to the following detailed description in conjunction with associated drawings which are briefly described below.

DETAILED DESCRIPTION

The present invention provides a heat lamp assembly that can include a heating lamp mounted onto a thermally conductive block that provides efficient reflection of radiation generated by the lamp onto a selected surface, for example, a surface of a semiconductor wafer disposed in an ion implantation chamber. The block can include a plurality of openings that allow ingress/egress of one or more cooling fluids to/from inner passageways allowing for removal of heat from the block. The block can also include further openings that allow a cooling fluid, e.g., a gas, to flow over the lamp to facilitate removal of heat from the lamp. These, and other features, are described herein.

Figure 1:
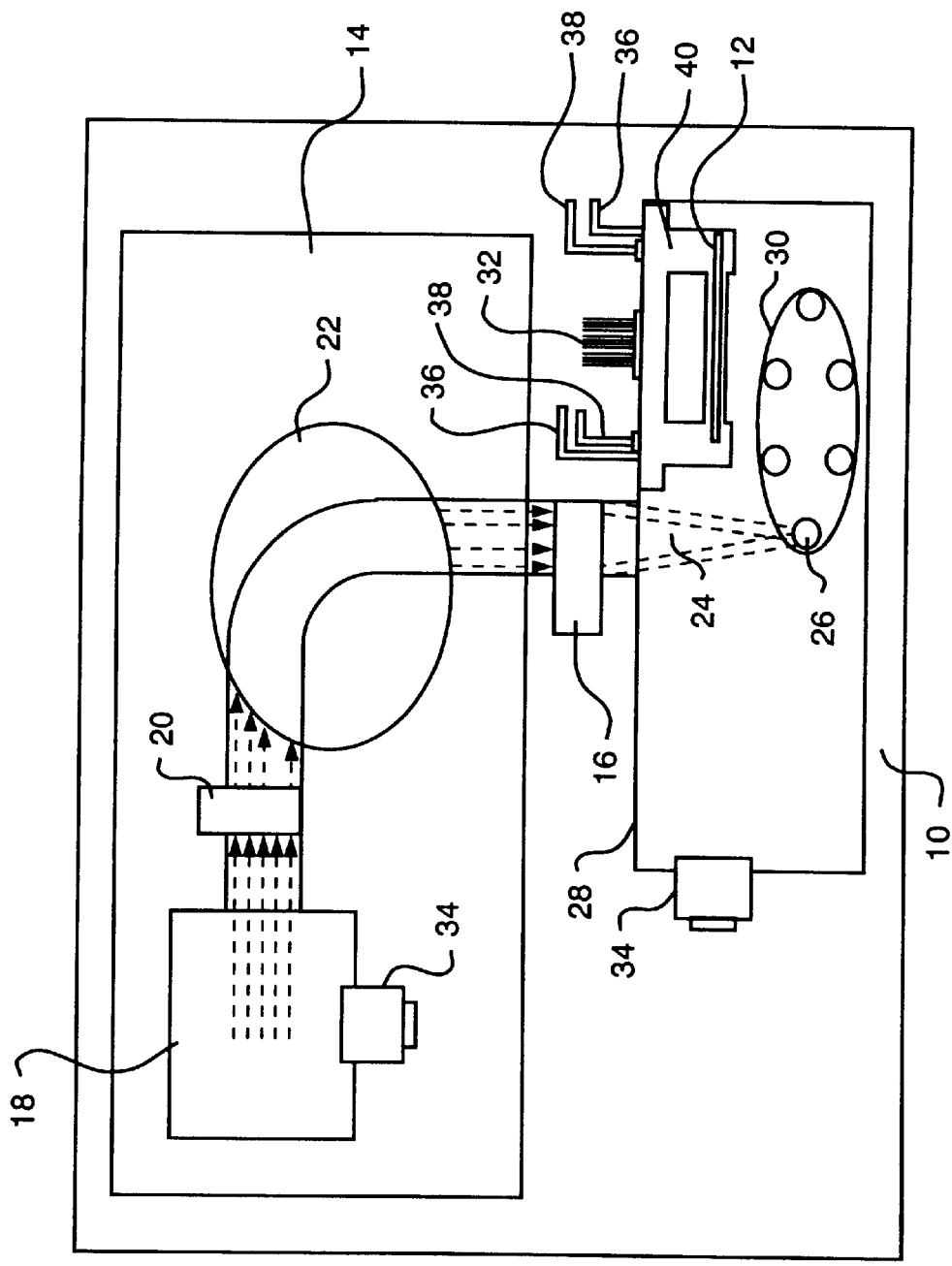
FIG. 1 depicts a typical ion implantation device in which a heating assembly according to the teachings of the invention is incorporated for heating semiconductor wafers positioned in an end station of the implantation device.

FIG. 1 illustrates an exemplary ion implantation apparatus 10 in which a heating assembly 12 coupled with a mount 40 according to the teachings of the invention is used. The ion implantation system 10 includes a beam delivery assembly 14, a beam-forming device 16, and an end-station 28. The beam delivery assembly 14 can include an ion source 18 that generates a beam of ions 24. The beam delivery assembly 14 can further include an ion analyzer 20, such as a magnetic analyzer, that selects appropriately charged ions. An accelerator 22 accelerates the selected ions to a desired energy, e.g., about 200 keV, and a beam-forming device 16 shapes the accelerated ions into an ion beam 24 having a selected cross-sectional shape and area.

The beam 24 is directed to a plurality of targets, e.g., semiconductor wafers 26, to implant a selected dose of ions therein. In this exemplary embodiment, the targets are disposed in the end-station 28 with a rotating support structure 30. A drive mechanism (not shown) can rotate the support structure 30 to sequentially expose one or more of the wafers 26 to the ion beam 24. During ion implantation, one or more vacuum pumps 34 evacuate the chambers, e.g., the ion source 18, accelerator assembly 22, and end-station 28.

The heating assembly 12 formed according to the teachings of the invention is disposed in the end-station 28 to heat the wafers 26 during ion implantation and/or subsequent annealing steps. The assembly is preferably positioned so as not to interfere with the ion beam 24. In the illustrated embodiment, the assembly 12 is attached to a mount 40 which provides for placement of the assembly 12 within the end-station 28. The mount 40 also provides for electrical coupling of the assembly 12 via electrical connectors 32. Cooling fluids can be circulated within the assembly 12 via fluid couplings 36, 38 provided by the mount 40 for the removal of heat from the assembly 12 and/or mount 40. The fluids can be, for example, water or air, or other fluids suitable for dissipating heat from the assembly. Multiple assemblies 12 can be placed within the end-station 28, and be coupled to a single mount 40. In some embodiments, multiple mounts 40 can be placed within the end-station 28.

Figure 2:
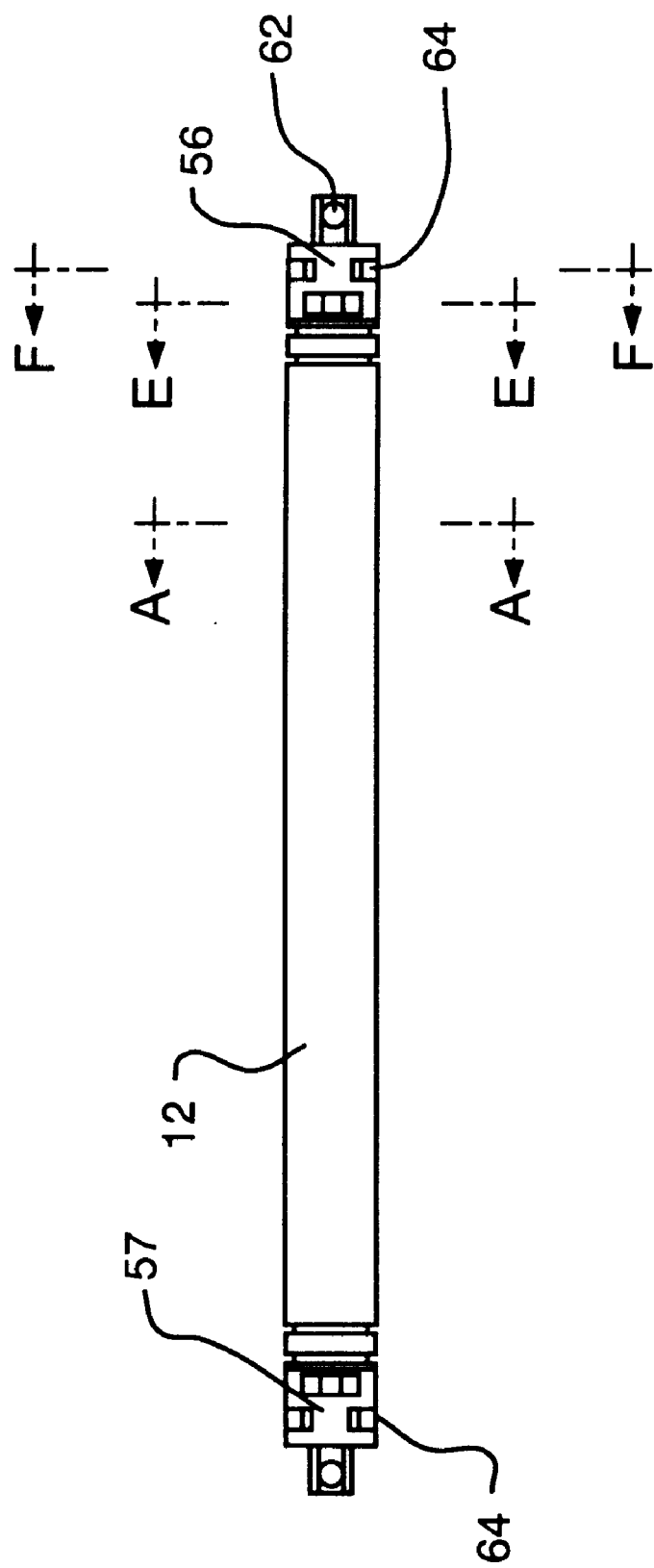
FIG. 2 shows a heating assembly according to the teachings of the invention.
Figure 3:
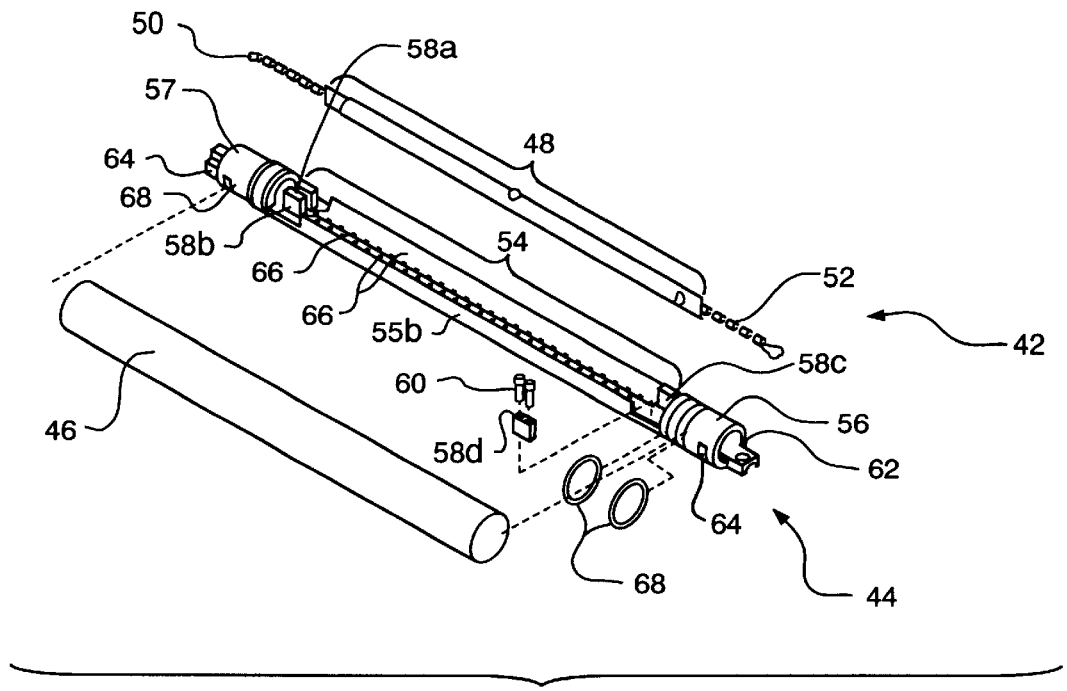
FIG. 3 illustrates major components of a heating assembly of the invention.

FIG. 2 shows the assembly 12, with FIG. 3 depicting major components of the assembly 12 according to one embodiment of the invention. The exemplary assembly 12 includes, among other elements, a heating lamp 42, a thermally conductive block 44 to which the heating lamp is mounted, and a cover 46.

The cover 46 insulates the lamp 42 and block 44 from an external environment, for example, a vacuum environment of the ion implantation chamber. In this embodiment, the cover 46 is in the form of a tube that surrounds the block 44 allowing operation of the heating assembly 12 within the vacuum of the ion implantation device, but the cover can be of different shapes and/or materials that are suitable depending on the external environment. Seals 68 located on end portions 57, 56 of the block 44 function with the cover 46 to separate the internal environment of the assembly 12 from the exterior environment. The illustrated seals are of a conventional "O-ring" configuration, but they can be labyrinth or other designs known in the art.

The heating lamp 42 has a central portion containing a heat producing material 48, providing heat upon electrical stimulation. The heating material 48 can be tungsten, quartz or any other material that produces sufficient heat upon electrical simulation for a desired application. In one embodiment, the heating lamp 42 can be approximately 10–12 inches long. In other embodiments, the length of the lamp 42 can vary according to the heating application and/or physical size limitations of a device in which the heat lamp assembly is disposed. Two end portions 50, 52 provide electrical coupling of the heat producing material 48 to a source of electrical power, and farther allow physical mounting of the heating lamp 42 to the block 44 via heat-isolation pads 58a–58d (collectively, 58).

Figure 7A:
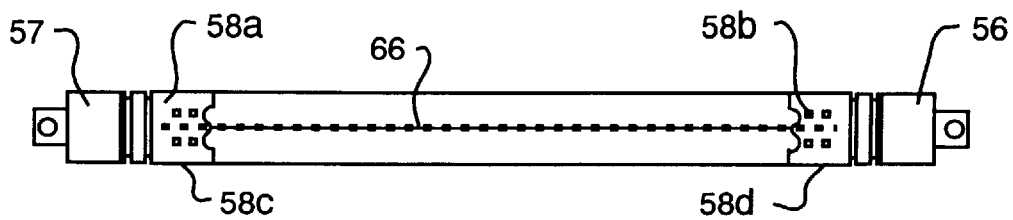
FIGS. 7A–7C are various cross-sectional views of a heating assembly of the invention.

The heat-isolation pads 58a, 58b, 58c, and 58d, (FIGS. 3, 7A) are mounted to the block 44 by utilizing, for example, a plurality of fasteners, such as, screws 60. The heat-isolation pads 58 are preferably positioned in proximity of the end portions 56, 57 to enhance isolation of heat generated by the lamp from these end portions, e.g., in proximity with high-temperature gradients, and consequently from the seals 68, thereby ensuring proper operation of the seals. The heat-isolation pads 58 can be formed of any material having a high coefficient of thermal conductivity. For example, the pads can be formed of aluminum. The pads can have a non-reflective surface facing the lamp to maximize heat transfer from the heating assembly. In some embodiments, the pads have a reflective surface on faces not receiving radiated energy from the heating assembly to increase cooling characteristics of the pads.

Figure 7B:
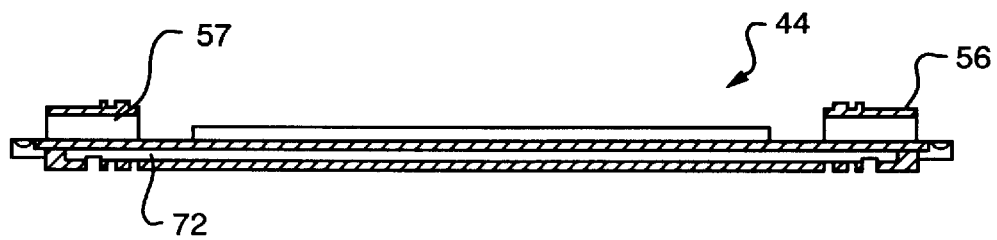
Figure 7C:

The thermally conductive block 44 includes a central portion 54 and two end portions 56 and 57. The end portions 56, 57 (FIGS. 2, 3, 5, 6 and 7) allow physical mounting of the lamp 42 to the block 44, and further allow electrical coupling of the lamp to a source of electrical power (not shown). In addition, the end portions 56, 57 include elements for coupling of the heat lamp assembly 12 to a mounting block as described in detail below with reference to FIG. 7 and FIG. 8. In particular, each end portion 56, 57 includes a tab, e.g., 62, or other coupling element, that can physically and electrically couple with an end portion 50, 52 of the heating lamp 42. In the illustrated embodiment, the lamp end portion, e.g., 52, is extruded or otherwise placed within a channel along a longitudinal axis of a block end portion 56, and coupled with the tab 62.

Figure 4:
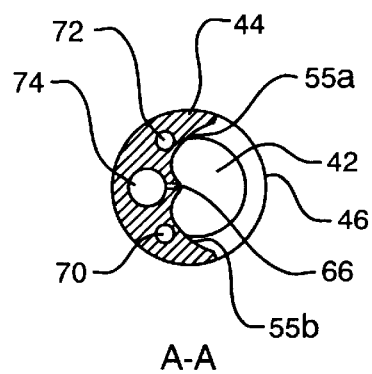
FIG. 4 is a cross-sectional view of the heating assembly of FIG. 2 illustrating inner passageways formed in a thermally conductive block of the assembly.
Figure 5:
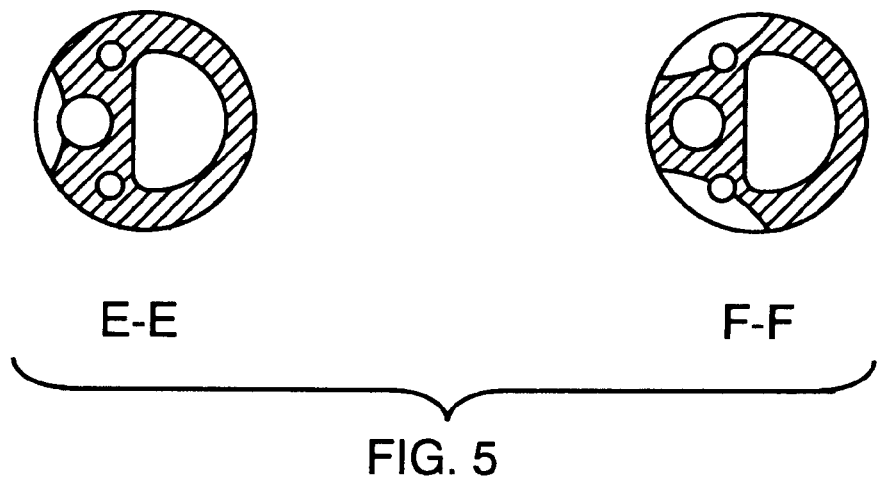
FIG. 5 shows cross-sectional views of the assembly of FIG. 2.
Figure 6:
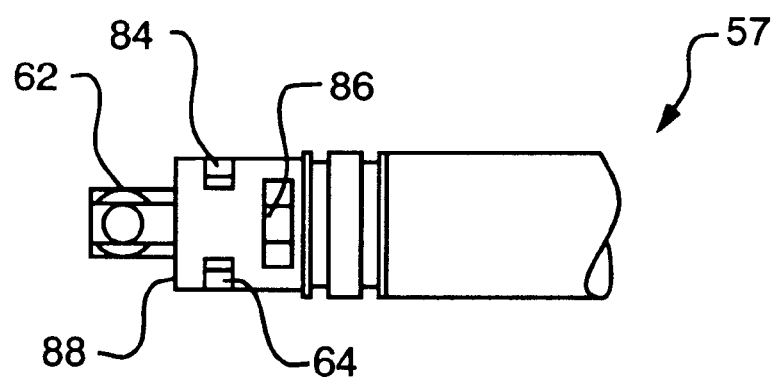
FIG. 6 is a detailed view of an end portion of the heating assembly of FIG. 2.

FIG. 3 and FIG. 4 depict two reflective sloping surfaces 55a, 55b which reflect light and heat generated by the lamp 42 onto a desired location, for example, a surface of a semi-conductor wafer 26 (FIG. 1). The reflective surfaces 55a, 55b can have a coating of a high reflectivity material, e.g., gold, that is deposited on the material forming the block 44, e.g., aluminum, via an intermediate primer layer, e.g., nickel. The primer layer advantageously enhances adhesion of the gold layer to the material forming the block 44.

A plurality of openings 66 formed in the reflective surfaces 55a and 55b allow flowing a cooling gas, for example, air, introduced into the block 44 via an inner passageway as described below, over the lamp 48 in order to remove heat therefrom. The cooling gas can be nitrogen or other compressible or non-compressible fluids suitable for contact with the heating lamp 48. In one illustrated embodiment (FIG. 3) the openings are arranged in two rows such that the openings in one row are offset relative to those in the other row to maximize an area of the lamp that will be in contact with the flowing gas. In other embodiments (e.g., FIGS. 4 and 6A), there can be a single row 66.

With further reference to FIG. 4 (See also FIGS. 5, 7B–7C) the thermally conductive block 44 further includes networks of inner passageways 70, 72, and 74 that extend along a longitudinal axis of the block and provide conduits for flow of fluids, such as, air and water. In this illustrated embodiment, cooling water is circulated through the block via passageways 70 and 72, for example, by introducing water into the block via passageway 70 and removing water from the block via the passageway 72, or vice versa. The flow of the cooling water advantageously cools the block to ensure proper operation of various seals, for example seal 68. Other cooling fluids, such as, ethylene glycol, or other heat-removing fluid suitable for circulation through the block can also be employed.

In this embodiment, the inner passageway 74 is in fluid communication with the openings 66 to allow flow of a cooling fluid, e.g., air, introduced via the passageway 74 under pressure, over the lamp 48. The cooling air is then extracted from the area between the lamp 48 and the interior of the cover 46 via a central coupling of one or both of the end portions 56, 57.

With reference to FIGS. 2, 3, 4 and 7A–7C, each end portion 57 includes openings that provide ingress and egress of fluids into and out of the inner passageways 70, 72, and 74. More particularly, cooling water (or other heat-removing fluid) can be introduced and extracted via ports 64 and 84, and cooling air (or other gaseous fluids) can be introduced into the inner passageway 70 via an inlet port 86 and removed via an outlet port 88.

A variety of materials can be employed to manufacture the thermally conductive block 44. For example, in one preferred embodiment, aluminum is utilized to form the block 44 as a unibody structure. The use of aluminum is particularly advantageous because it readily allows machining, e.g., boring a network of inner passageways and seal seats in the block. The manufacture can utilize, for example, so-called gun-drilling techniques to generate inner passageways in a unitary block of aluminum instead of braise-joining multiple machined pieces.

As described above, a primer coating, e.g., nickel, can be applied to the aluminum surfaces of the block, and a coating of a highly reflective material, such as, gold, can subsequently be applied to the primer so as to generate highly reflective surfaces for directing radiation generated by the lamp to a desired location.

Figure 8:
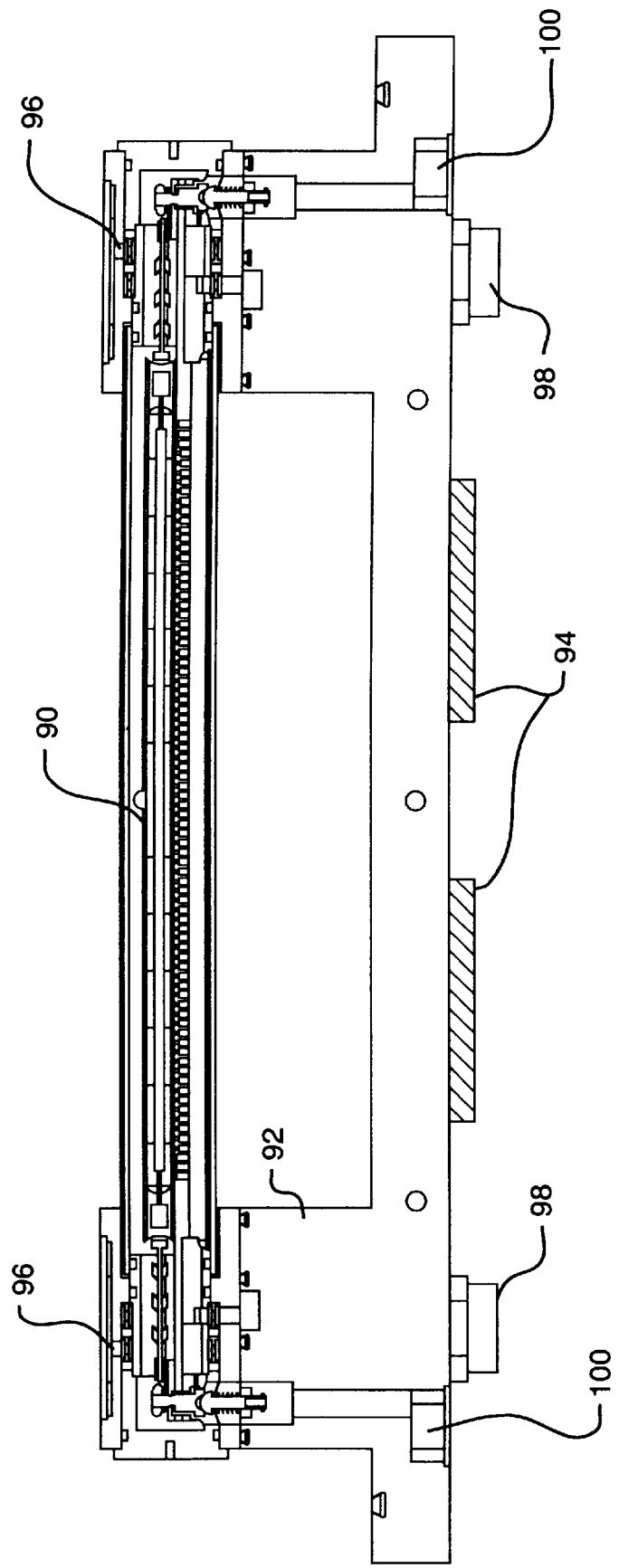
FIG. 8 illustrates a heating assembly according to the invention coupled to a mount for positioning in an end station of an ion implantation chamber.

With reference to FIG. 8, the heat lamp assembly 90 can be coupled to a mount 92 that allows positioning the heat lamp assembly within an ion implantation chamber. The mount 92 provides electrical couplings 94 cooling water couplings 96 and cooling air couplings 98, 100. The couplings can have a variety of different configurations. For example, the air inlet coupling 98 can be a flange coupling, a nipple coupling, or any other coupling known in the art. Multiple heating lamp assemblies of the invention can be coupled to a single mount, thus enabling a variety of configurations depending on physical shape and dimensions of an ion chamber and desired wafer temperatures to be achieved.

In some embodiments, sensors can be attached to the heating assembly and/or mount to control the heat output, cooling water and air flow, and other characteristics of operational parameters. Further, the block can be connected to anti-static or other voltage differential detection/correction equipment to protect the mount and coupled assemblies from electrical damage. In some embodiments, sensors capable of detecting the temperature of a wafer 26 can be used, such as a thermocouple, infrared sensor, or other temperature-sensing device.

Those of ordinary skill in the art will appreciate that various modifications can be made to the above embodiments without departing from the scope of the claimed invention as described by claims. For example, the size of the heating assembly can vary, the heating capacity can vary, and the cooling fluids can vary, depending on the requirements of the application.

What is claimed is:

1. A heating assembly comprising
   a thermally conductive mounting block to which one or more heating lamps can be mounted, the block having a unibody construction and
   at least one network of machined inner passageways through which one or more cooling fluids can be transported to cool the unibody mounting block,
   a cover fixable to the mounting block to surround one or more heating lamps, and
   one or more seals coupling the mounting block and the cover to insulate the lamps from an external environment and permitting passage of a gaseous cooling fluid through the cover to cool the heating lamps.

2. The heating assembly of claim 1, further comprising one or more cooling pads coupled to the mounting block and also couplable to the heating lamps, the pads isolating heat generated by the lamps from the seals.

3. The assembly of claim 2, wherein said cooling pads are disposed in proximity of said seals.

4. The assembly of claim 1, wherein the mounting block is formed of aluminum.

5. The assembly of claim 1, wherein the assembly further comprises a reflective coating disposed on at least a surface of the mounting block facing the heating lamps.

6. The assembly of claim 5, wherein the highly reflective material is gold.

7. The assembly of claim 5, further comprising a primer layer disposed between said thermally conductive block and said reflective coating.

8. The assembly of claim 7, wherein the primer layer is formed of a nickel composition.

9. The assembly of claim 1, wherein at least one of the inner passageways allows for circulation of a cooling liquid through the block.

10. A heating device for use in a vacuum environment comprising:
   one or more heating assemblies, each comprising
      a thermally conductive unibody mounting block to which one or more heating lamps can be mounted, the block having at least one network of machined inner passageways through which one or more cooling fluids can be circulated,
      a reflective coating disposed on at least a surface of the block facing the heating lamps for directing radiation generated by the lamps onto said wafer,
      a cover fixable to the mounting block to surround one or more heating lamps, and
      one or more seals coupling the mounting block and the cover to insulate the lamps from a vacuum environment, and
   a holding device coupled to one or more of said heating assemblies for positioning said assemblies in an end station of the ion implantation chamber,
      the holding device comprising electrical and fluid coupling with the heating assembly and placed within the vacuum environment.

11. The device of claim 10, wherein the mount comprises an aluminum composition.

12. The device of claim 10, wherein the reflective coating comprises a gold composition layered over a primer layer of a nickel composition.

13. The device of claim 10, wherein a network of inner passageways allows for circulation of a cooling fluid and cooling air within the block.

14. The device of claim 13, wherein the network of inner passageways are bored from the unibody mounting block.

15. The device of claim 10, wherein electro-mechanical sensors are coupled with the mount, the sensors detect electrical and heat characteristics of the mount and the assembly.

16. A heating device, comprising
   a thermally conductive unibody mounting block to which at least one heating lamp can be mounted,
   a first inner passageway formed in said mounting block through which a liquid can flow for extracting heat from said block,
   a second inner passageway formed in said mounting block through which a gaseous fluid can flow,
   one or more openings formed in said second passageway so as to allow flow of said gaseous fluid over said heating lamp to extract heat therefrom, and
   a cover fixable to said mounting block to surround said heating lamp, and one or more seals coupling the mounting block and the cover to insulate the lamp from an external environment.

17. A heating device, comprising
   a unibody mounting block to which at least one heating lamp can be mounted, said mounting block being formed of aluminum,
   a plurality of inner passageways formed in said mounting block through which one or more cooling fluids can flow,
   a plurality of openings formed in at least one of said inner passageways to allow flow of at least one of said cooling fluids onto said heating lamp for extracting heat therefrom,
   a cover fixable to said mounting block to surround said heating lamp, and one or more seals coupling the mounting block and the cover to insulate said heating tamp from an external environment.

18. The heating device of claim 17, wherein said external environment is a vacuum environment.

* * * * *